(12) United States Patent
Harris et al.

(10) Patent No.: US 7,371,998 B2
(45) Date of Patent: May 13, 2008

(54) THERMAL WAFER PROCESSOR

(75) Inventors: Randy A. Harris, Kalispell, MT (US); Gregory J. Wilson, Kalispell, MT (US); Paul R. McHugh, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 126 days.

(21) Appl. No.: 11/428,742

(22) Filed: Jul. 5, 2006

(65) Prior Publication Data

US 2008/0006617 A1    Jan. 10, 2008

(51) Int. Cl.
*F27B 5/04*     (2006.01)
*F27B 5/14*     (2006.01)
*F27B 11/02*    (2006.01)
*F27D 3/12*     (2006.01)
*F27D 1/12*     (2006.01)

(52) U.S. Cl. .................. 219/390; 219/403; 219/411; 432/241; 392/416; 392/418; 165/64; 118/724; 118/725; 118/729

(58) Field of Classification Search .................. None
See application file for complete search history.

(56) References Cited

U.S. PATENT DOCUMENTS

| | | | |
|---|---|---|---|
| 4,738,618 A | 4/1988 | Massey et al. | |
| 4,925,388 A | 5/1990 | Iseki et al. | |
| 5,000,682 A | 3/1991 | Heidt et al. | |
| 5,590,996 A | 1/1997 | Thompson et al. | |
| 5,820,366 A * | 10/1998 | Lee | 432/241 |
| 5,846,073 A | 12/1998 | Weaver | |
| 5,904,478 A | 5/1999 | Weaver et al. | |
| 5,908,292 A | 6/1999 | Smith et al. | |
| 5,947,718 A | 9/1999 | Weaver | |
| 5,994,675 A | 11/1999 | Bethune et al. | |
| 6,164,963 A | 12/2000 | Weaver | |
| 6,191,388 B1 | 2/2001 | Cleaver et al. | |
| 6,879,778 B2 * | 4/2005 | Yoo et al. | 392/416 |

* cited by examiner

*Primary Examiner*—J. Pelham
(74) *Attorney, Agent, or Firm*—Perkins Coie LLP; Kenneth H. Ohriner

(57) ABSTRACT

A thermal processor may include a cooling jacket positionable around a process chamber within a process vessel or jar. A heater can move into a position substantially between the process chamber vessel and the cooling jacket. A holder having multiple workpiece holding positions is provided for holding a batch or workpieces or wafers. The process chamber vessel is moveable to a position where it substantially encloses the holder, so that wafers in the holder may be processed in a controlled environment. A cooling shroud may be provided to absorb heat from the heater before or after thermal processing. The thermal processor is compact and thermally shielded, and may be used in an automated processing system having other types of processors.

19 Claims, 12 Drawing Sheets

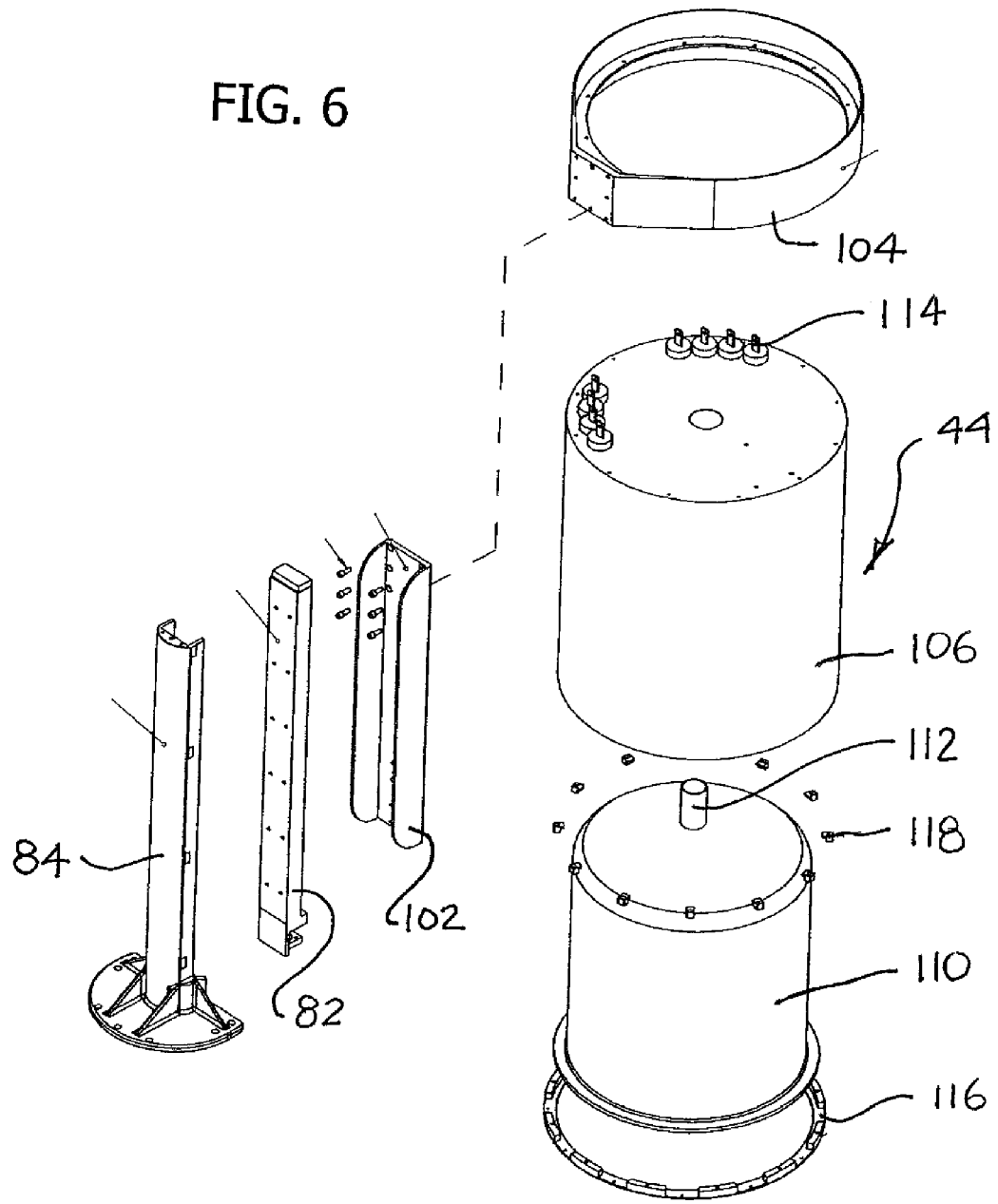

THERMAL WAFER PROCESSOR

BACKGROUND

Virtually all modern electronic devices are made with integrated micro-electronic circuit devices. These devices are generally formed on a wafer or substrate using multiple processing steps. Some of these processing steps are performed by heating the wafer. For example, rapid thermal anneal and furnace anneal are processes performed by heating a wafer to change its electrical properties. Different heat treatments (varying in time, temperature profiles, process gases, etc.) are used to provide different effects. These heating processes may be used to activate dopants, change film interfaces, densify deposited films, change states of grown films, repair damage from ion implantation, move dopants or drive dopants from one film into another or from a film into the wafer substrate. Other thermal processes include polyimide bake, lead free reflow, metal anneal, vacuum drying, photoresist bake and low-k bake.

While different temperatures and temperature profiles are used in different thermal processes, many of these thermal processes require heating the wafers to 500° C. or even higher. Operation in these temperature ranges generally requires high capacity heating elements, extensive insulating and cooling elements, and sufficient clearance around the thermal processor to avoid affecting adjacent objects, equipment, or people. As a result, thermal processors, and especially batch thermal processors, have conventionally been provided as relatively large and independent apparatus or systems dedicated to performing only thermal processing.

The high operating temperatures of thermal processors of course creates various problems when trying to provide a single system having a thermal processor and other types of processors. However, notwithstanding the heat related effects within a processing system, the thermal processor itself must be able to provide reliable, controllable, and substantially uniform wafer heating. Consequently, these requirements may tend to conflict with system requirements, such as size limitations, heat up/cool down cycle time requirements, loading/unloading parameters, etc. Accordingly, there is a need for a thermal processor having improved performance. There is also a need for a thermal processor that may be used in a processing system having other types of processors.

SUMMARY OF THE INVENTION

A new batch thermal processor is designed so that it can rapidly heat up and cool down. This reduces the time needed to cycle a batch of wafers through the processor. This new thermal processor also may include elements to prevent or reduce transfer of heat from the processor to adjacent areas. As a result, this new thermal processor may be used nearby other types of processors and equipment. Consequently, the space required for thermal processing is reduced. In addition, this new thermal processor may also correspondingly be used in an automated processing system having other types of processors.

In one aspect, a thermal processor may include a cooling jacket positionable around a process chamber within a process vessel or jar. A heater may be movable into a position substantially between the process chamber vessel and the cooling jacket. In this position, the heater may substantially surround the process chamber vessel. A holder having multiple workpiece holding positions is provided for holding a batch or workpieces or wafers. The process chamber vessel is moveable to a position where it substantially encloses the holder, so that wafers in the holder may be processed in a controlled environment. A cooling shroud may be provided to absorb heat from the heater before or after thermal processing.

Other objects and features will become apparent from the drawings and following detailed description, which show this new thermal processor and thermal processing systems. The drawings and detailed description are examples of how this new thermal processor may be designed and operated, and are not intended to define the limits or scope of the invention. The invention resides as well in sub-combinations of the thermal processor, its elements, systems, and steps.

BRIEF DESCRIPTION OF THE DRAWINGS

In the drawings, wherein the same reference number indicates the same element in each of the views:

FIG. 6 is an exploded perspective view of the heater shown in FIG. 5.

DETAILED DESCRIPTION OF THE DRAWINGS

Figure 1:
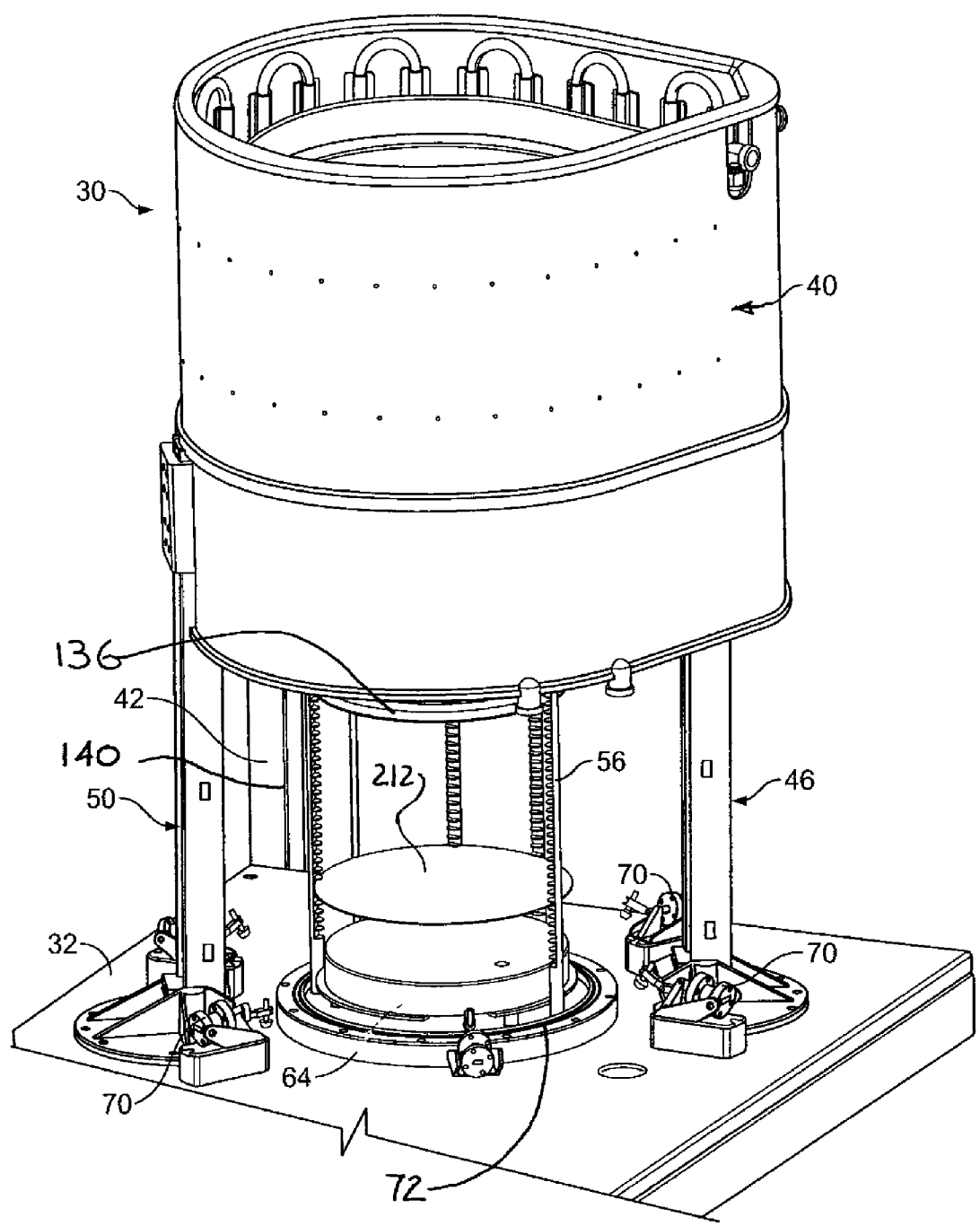
FIG. 1 is a perspective view of a thermal processor in a load/unload position.
Figure 2:
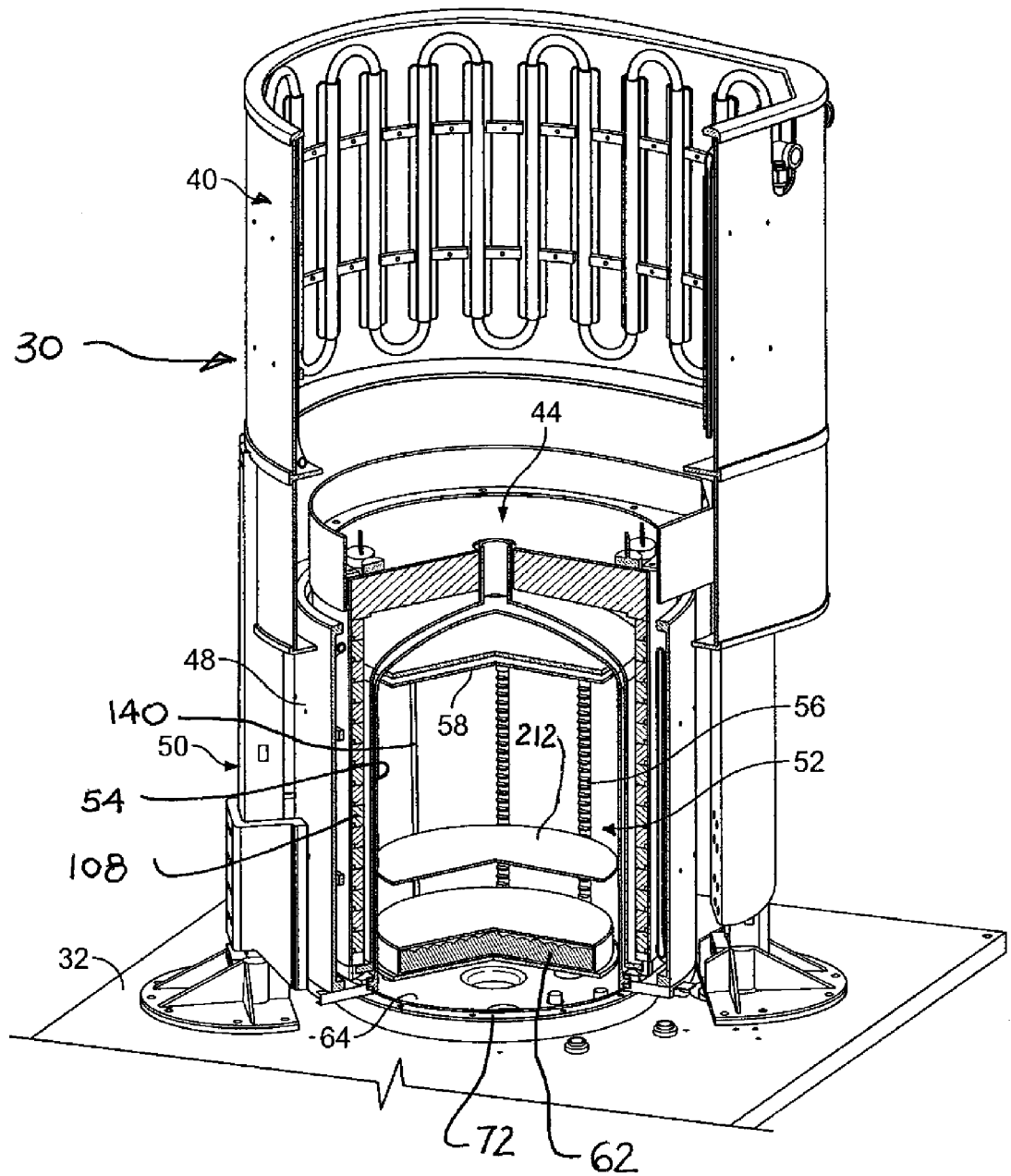
FIG. 2 is a perspective view, in part section, of the processor shown in FIG. 1, in a process position.
Figure 3:
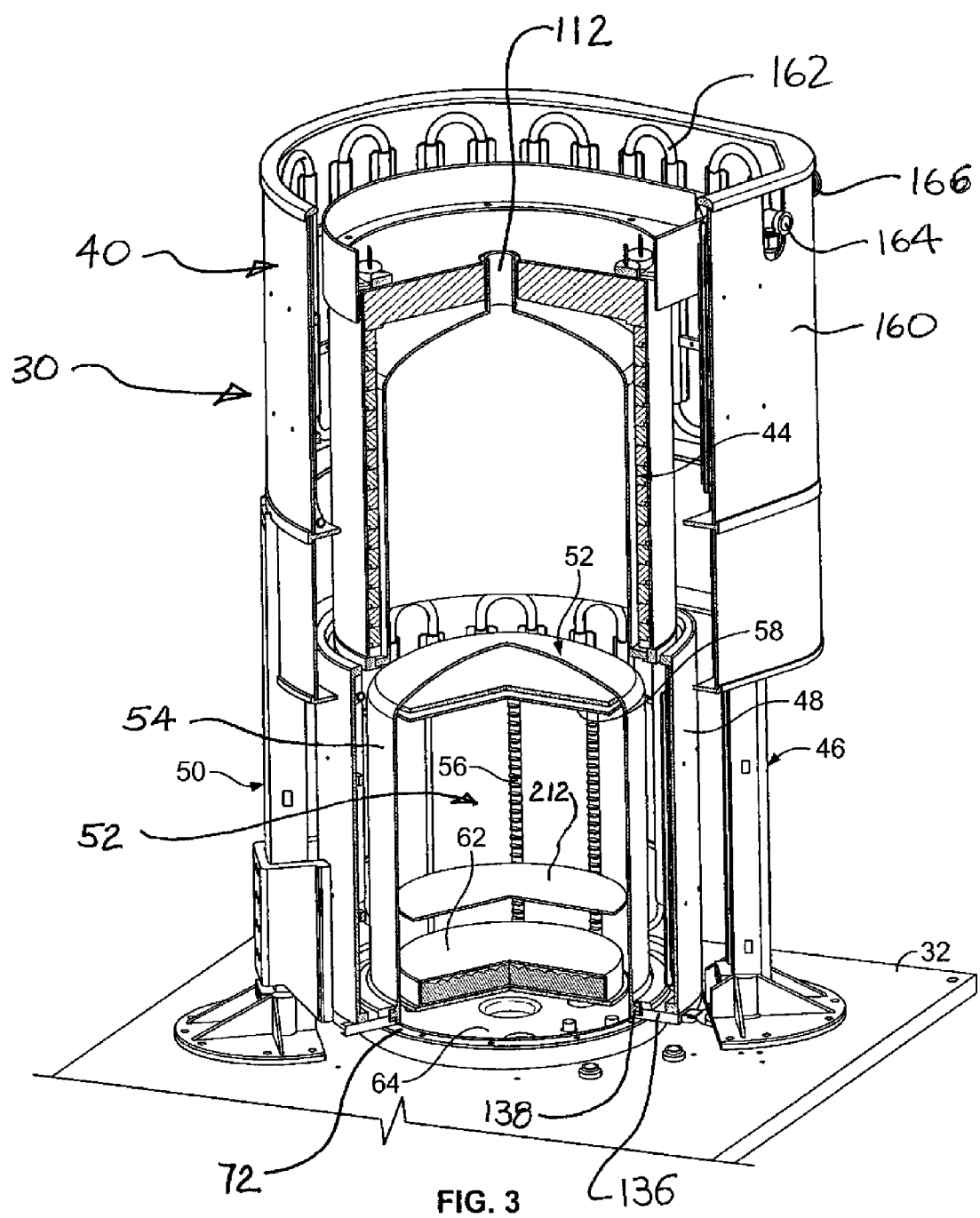
FIG. 3 is a view similar to FIG. 2 and showing the processor in a pre-heat or cool down position.

Turning now in detail to the drawings, as shown in FIGS. 1-3, a thermal processor 30 has a process chamber 52 formed within a process vessel or jar 54. In FIGS. 2 and 3, the jar 54 is in a process position, and is sealed against a base plate 64 via a base seal 72. The jar 54 may be quartz, Pyrex glass, or even metal, depending on the processes to be carried out.

Figure 10:
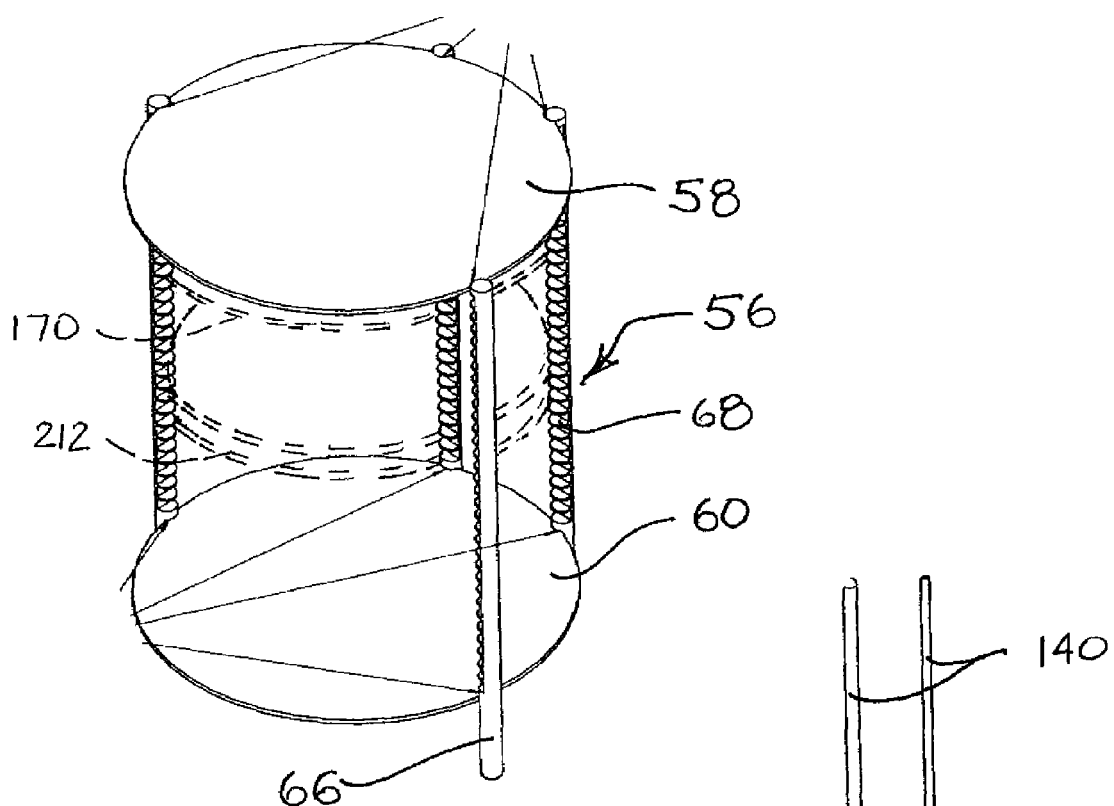
FIG. 10 is a perspective view of the wafer holder shown in FIGS. 1-3.

A workpiece or wafer holder 56 is attached to the base plate 64. Referring momentarily to FIG. 10, the wafer holder 56 has posts 66 joined to an upper plate 58 and a lower plate 60. Slots or grooves 68 in the posts 66 provide positions for holding a stacked array of wafers 212 vertically spaced apart from each other and in a substantially parallel and horizontal orientation. The posts 66 of the wafer holder 56 are typically quartz. The upper and lower plates 58 and 60, and the posts 66, may be silicon, silicon carbide, quartz, or various other materials. The posts 66 may be fused or otherwise attached to the edges of the plates. Dummy wafers 170, shown in dotted lines in FIG. 10, may optionally be provided at the upper or lower ends of the wafer holder 56 to reduce heat losses at the ends of the process chamber 52 or to otherwise provide greater temperature uniformity during thermal processing. The dummy wafers may be removable from the wafer holder 56 or permanently attached to the wafer holder 56.

As shown in FIGS. 2 and 3, a chamber cooling jacket 48 may be positioned around the process jar 54. As used here, surround or around means enclosing in two dimensions, i.e., front/back and left/right, and not necessarily also enclosing in the third dimension, i.e., top/bottom. The chamber cooling jacket 48 and the jar 54 move vertically relative to the wafer holder 56. One way of achieving this movement is by supporting the chamber cooling jacket 48 and the jar 54 on a jacket/jar lifter 50. The lifter 50 moves the jacket 48 and the jar 54 to and from the process or down position shown in FIGS. 2 and 3, and the up or load/unload position shown in FIG. 1.

Referring to FIGS. 1-3, a heater 44 also moves vertically to and from the preheat or cool down position shown in FIGS. 1 and 3, and the process or down position shown in FIG. 2. This heater movement may be achieved by supporting the heater 44 on a heater lift 46. An upper cooling section or shroud 40 is held in place on fixed surfaces or elements of one or both of the lifts 46 and 50, or on other appropriately located structure. The cooling shroud 40 may be fixed in place relative to the base plate 64 and the holder 56. The process jar 54, the cooling jacket 48 and the heater 44 may alternatively be moved using other types of apparatus besides the lifts 46 and 50. For example, these elements may be moved by a single combined lift device. The lifting device(s) may also alternatively be supported on a sidewall or overhead structure, instead of the base 32. Many different types of lifting devices, and lifting device orientations, may be used and the specific form used is not essential to the processor 30 or the methods performed.

Figure 7:
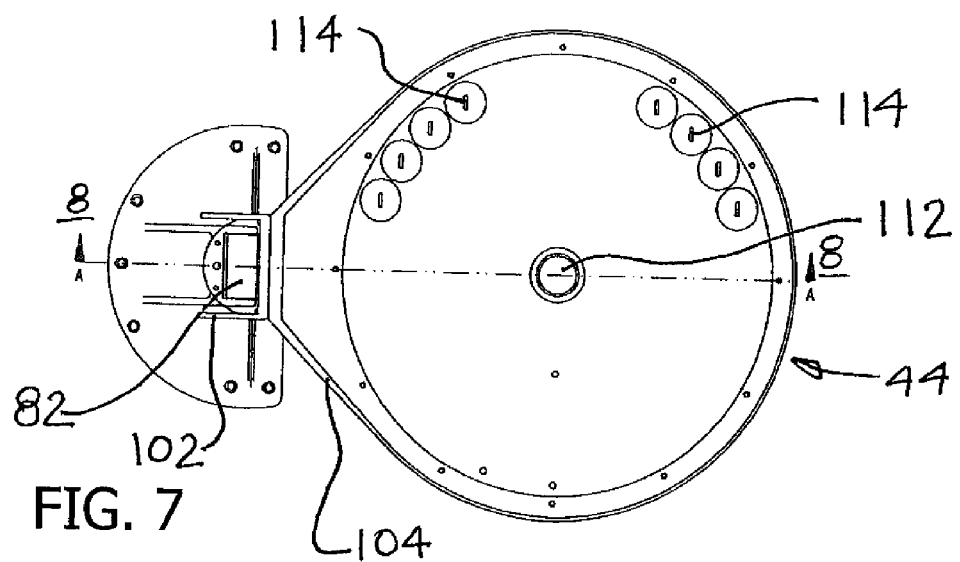
FIG. 7 is a top view of the heater shown in FIG. 4.
Figure 8:
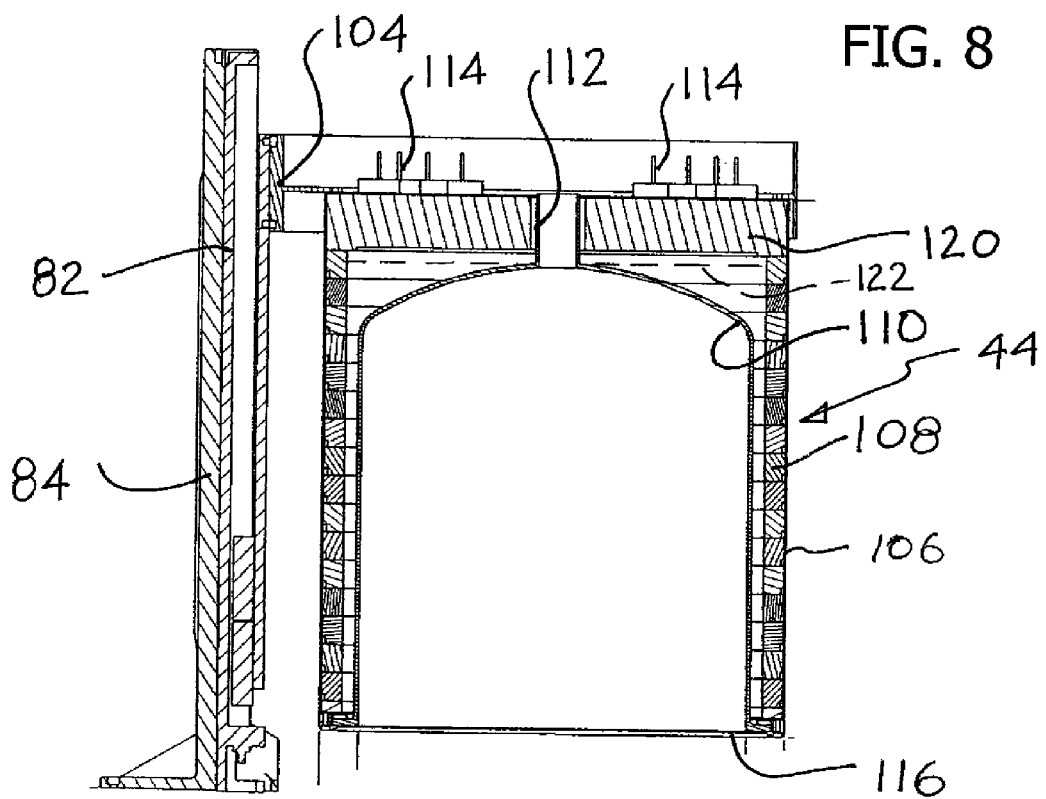
FIG. 8 is a section view taken along line 8-8 of FIG. 7.

Turning to FIGS. 6-8, the heater 44 may include electrical heating elements 108 between a heater cylinder or body 106 and a heater liner jar 110. A vent 112 may optionally be provided at the top of the heater liner jar 110. Terminals 114 provide electrical connections to the heating elements 108. Wiring is not shown in the drawings for clarity of illustration. The heater 44 is attached to the heater lift 46, in this case by attaching the heater cylinder 106 to a ring support 104 which in turn is attached to a heater mounting channel 102. The heater mounting channel 102 is in turn attached to a lift ball screw 82 supported on a heater base post 84, as shown in FIG. 6. An insulator plate 120 may be provided between the top surface of the heater cylinder 106 and the heater liner jar 110, as shown in FIG. 8. Referring once again to FIG. 6, the heater liner jar 110 is attached to the heater cylinder 106 via a heater base ring 116 and base ring clamps 118. The heating elements 108 may be divided into multiple zones which may be separately controlled. In the heater 44 shown in the drawings, the heating elements 108 are divided into six separate heating zones The heating elements 108 and other elements of the heater may be provided as described in U.S. Pat. No. 5,904,478, incorporated herein by reference.

Figure 5:
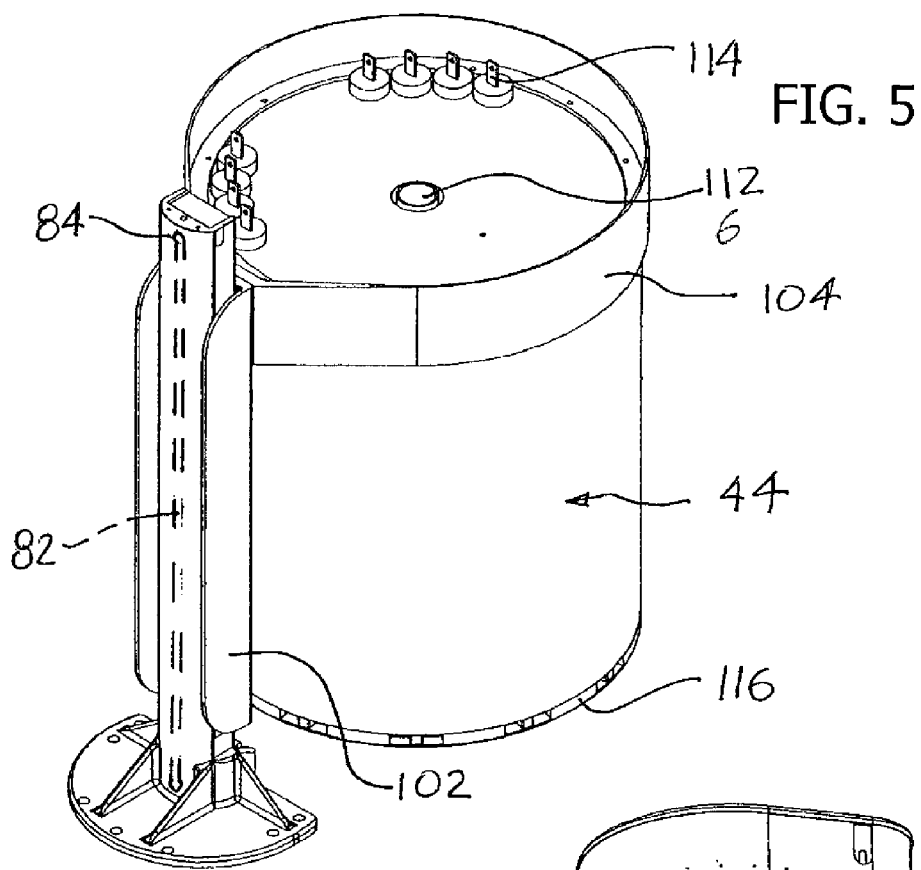
FIG. 5 is a top perspective view of the heater shown in FIGS. 2 and 3.
Figure 4:
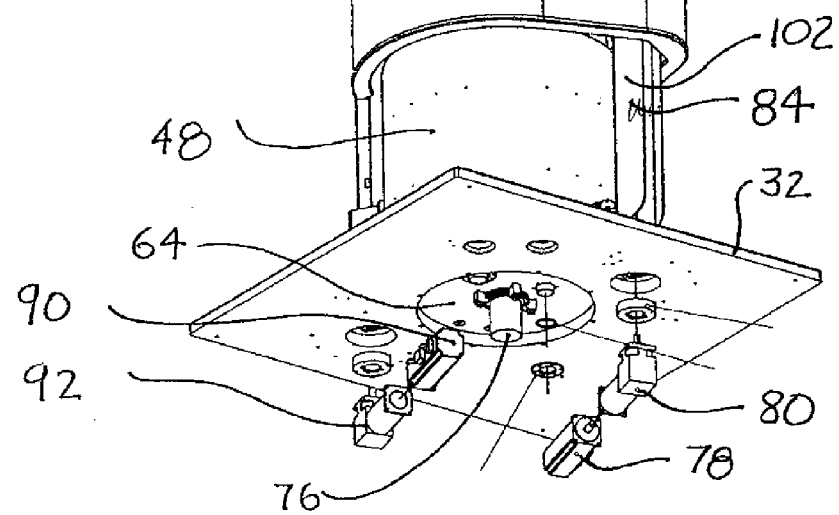
FIG. 4 is a bottom perspective view of the processor shown in FIGS. 1-3.

Referring to FIGS. 4 and 5, the heater base post 84 is attached to a supporting structure, such as a deck or base plate 32. A heater lift motor 78 drives the heater lift ball screw 82 through a gear drive 80, as shown in FIG. 4. Energizing the heater lift motor 78 accordingly raises or lowers the heater 44.

Figure 9:
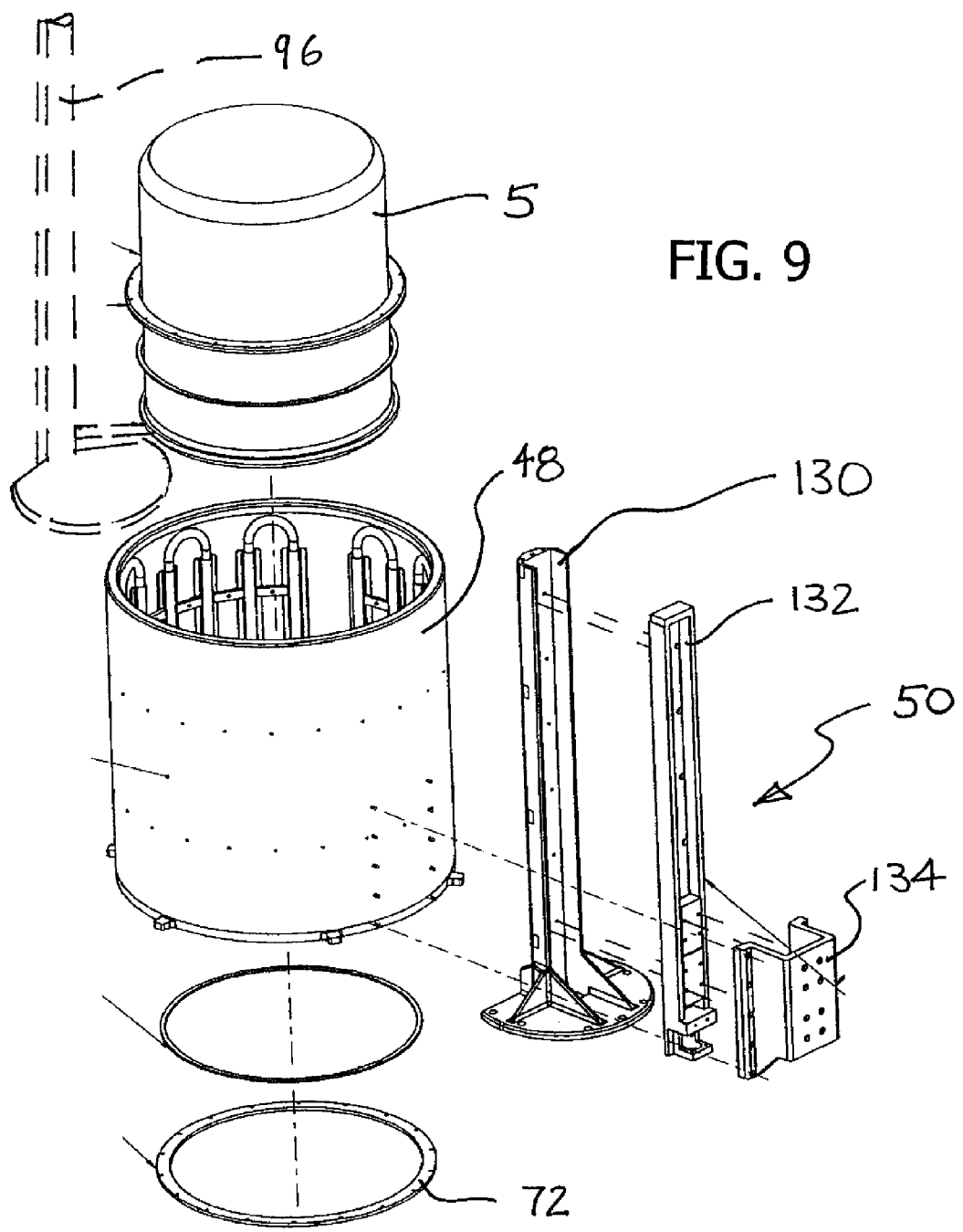
FIG. 9 is an exploded perspective view of the process chamber and the chamber cooling jacket shown in FIGS. 2 and 3.

In the example shown in FIGS. 2 and 9, the chamber cooling jacket 48 is attached to a chamber lift ball screw 132 via a mounting plate 134. The chamber lift ball screw 132 is supported on a chamber base post 130 mounted on the deck 32. Referring momentarily to FIG. 4, a chamber lift motor 90 drives the chamber lift ball screw 132 through a chamber gear drive 92. As shown in FIG. 3, a chamber lift ring 136 is attached at the lower end of the chamber cooling jacket 48. A lower external jar ring 138 rests on or is secured on top of the chamber lift ring 136. Referring to FIGS. 4 and 9, energizing the chamber lift motor 90 drives the chamber lift ball screw 132 through the chamber gear drive 92, causing the chamber cooling jacket 48 to move vertically. In this particular design, since the jar ring 138 on the jar 54 is supported on the chamber lift ring 136, the jar 54 moves vertically with the chamber cooling jacket 48.

Figure 11:
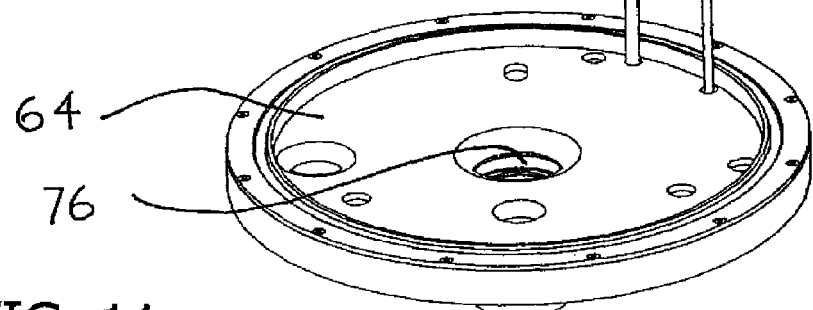
FIG. 11 is a top perspective view of the base plate shown in FIGS. 2 and 3.
Figure 12:
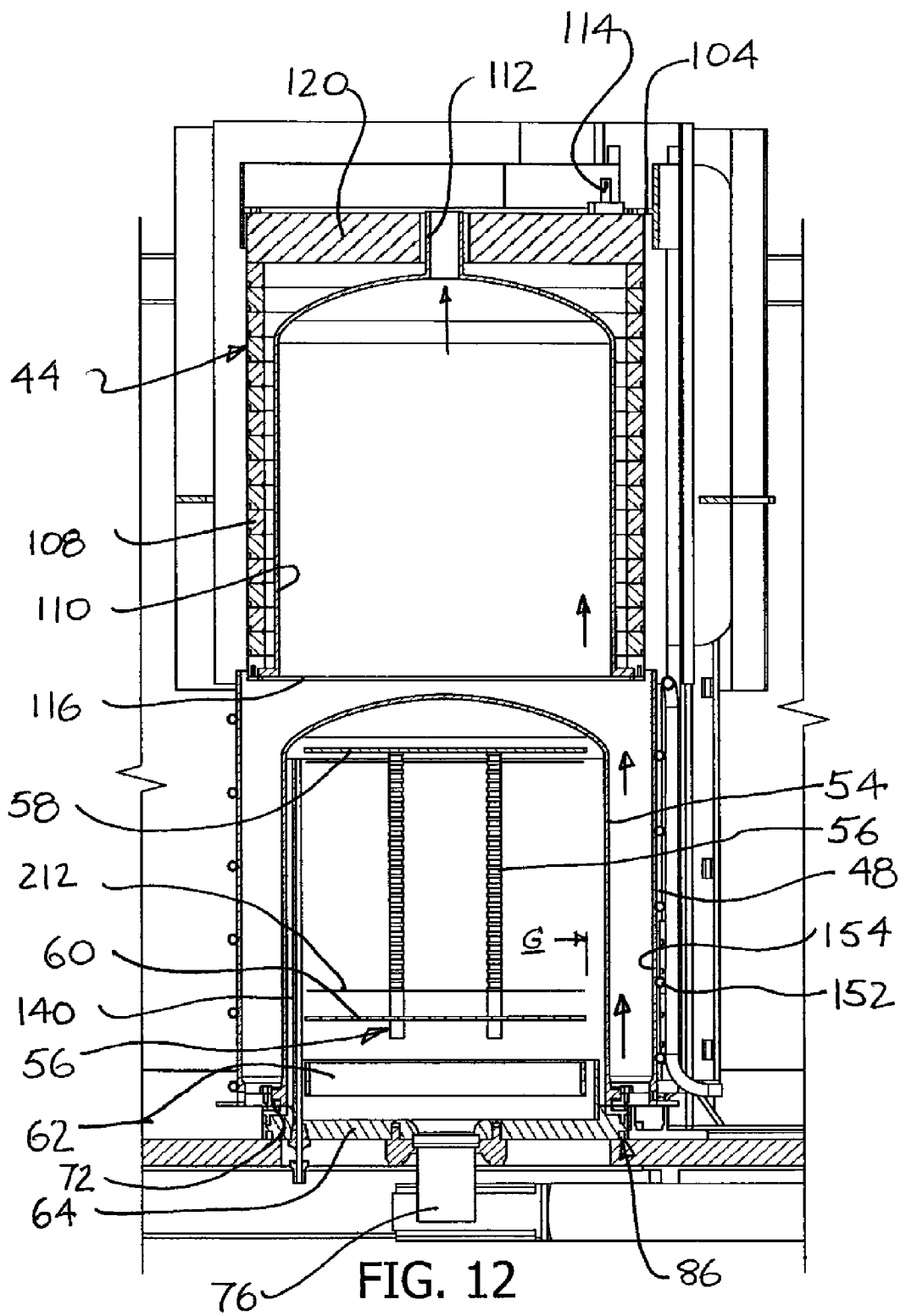
FIG. 12 is a section view of the processor as shown in FIG. 3.

Turning to FIGS. 11 and 12, the base plate 64 may include a centrally located vacuum outlet 76 connected to a vacuum source. One or more gas supply tubes 140, each connected to a process chemical gas supply source, extend up from the base plate 64. The base plate 64 is typically cooled via cooling coils and/or forced convection. As shown in FIG. 12, a base heater 62 may be provided on the base plate 64 to help to maintain desired temperatures at the bottom of the process chamber 52, despite heat losses to the cooled base plate 64. As shown in dotted lines in FIG. 8, a top heating element 122 is generally provided at the top of the heater 44. The base plate 64 and the holder 56 supported on the base plate, are stationery and ordinarily do not move. Rather, the process jar 54, the cooling jacket 48 and the heater 44 move, as described below.

Referring to FIGS. 3 and 12, the chamber cooling jacket 48 typically may have jacket cooling coils 152 extending around a jacket cylinder 154. Similarly, the upper cooling shroud 40 may include shroud cooling coils 162 attached to a shroud body 160. The jacket cooling coils 152 and the shroud cooling coils 162 are generally connected to a supply of cooling liquid, for example water, via inlets 164 and outlets 166, as shown in FIG. 3. The shroud body 160 and the jacket cylinder 154 are typically made of a material having high thermal conductivity, such as a metal, e.g., aluminum, and may be provided with an anodized black surface finish to better absorb radiant heat. The jacket cylinder 154, heater cylinder 106 and the jar 54 typically have a round cross section shape. The shroud body 160 has an irregular shape to provide clearance for the heater lift 46 within the upper cooling shroud 40.

The processor 30 may perform various processes. In a typical process sequence, wafers 212 are initially loaded into the wafer holder 56. The processor 30 is in the load/unload position as shown in FIG. 1. In this position, the jar 54 and the cooling jacket 48 are both in the up position. The wafers 212 may be loaded into the wafer holder 56 manually or more typically, via a robot. The wafers 212 may be loaded by a robot singly, or in batches of 2, 3, 4, 5 or more wafers. The wafer holder 56 shown in the drawings is adapted to hold 25 wafers, and may be adapted to hold other numbers of wafers depending on the process and application. Since standard industry wafer containers such as Front Opening Unified Pods (FOUPs) often have a 25 wafer capacity, a wafer holder with 25 wafer holding positions allows a full pod of wafers to be processed in a batch. A robot moving wafers between a pod and the processor 30 may be provided with an end effector holding 25 wafers, so that the processor 30 may be fully loaded with wafers in a single robot movement or load sequence.

After loading is complete, the lift motor 90 is energized to lower the cooling jacket 48 and the jar 54. The lower end of the jar 54 rests on the seal 72, as shown in FIGS. 2, 3, and 12. The jar 54 may be pressed down onto the seal 72 to provide a more reliable seal. In the example shown in the drawings, this is achieved using pneumatic clamps 70 shown in FIG. 1. With the jar 54 sealed, vacuum may be applied via the vacuum outlet 76, to reduce the pressure within the jar 54. Process gases may also be introduced into the jar 54 by the gas supply tubes 140, before and/or during heating. The process chamber 52 may be filled with a gas having a relatively high thermal conductivity, such as helium. A gas having a high thermal conductivity may reduce cooling time, by improving heat transfer between the edges of the wafers and the process jar 54. Gas flow may also optionally be set up within the process chamber 52, by directing gas flow from the gas supply tubes 140 within or through the process chamber 52 and out through the vacuum outlet 76. While two process gas supply tubes 140 are shown, other numbers may be used. The gas supply tubes 140 shown in FIG. 11 may also have other orientations as may be helpful to set up a desired gas flow within the process chamber 52.

The heater lift motor 78 is then turned on to lower the heater 44 from the up position shown in FIG. 3 to the down or process position shown in FIG. 2. In FIG. 2, the heating elements 108 of the heater 44 are positioned between the jar 54 and the cooling jacket 48. As shown in FIG. 2, the wafers 212 are positioned in the wafer holder 56 between the upper plate 58 and the lower plate 60. As a result, the wafers 212 are spaced apart from the top and bottom ends of the jar 54, to provide more uniform heating. Referring to FIGS. 2, 10 and 12, with the heater 44 in the process position, the heating elements 108 extend above the upper plate 58 and below the lower plate 60, which also contributes to uniform heating. The base heater 62 is turned on and provides heat at the bottom end of the jar 54. The top heating element 122 is also turned on and heats the upper end of the jar 54.

The heating elements in the heater 44 and the base heater 62 may be controlled by a computer controller, to heat the wafers 212 to a desired temperature, at a desired rate. The heating elements 108 in the heater 44 may optionally be turned on and allowed to reach a selected temperature before the heater 44 is lowered down around the jar. This preheating of the heater 44 may be used to reduce overall cycle time. The temperatures, duration, and rates used in heating the wafers 212 may be adjusted depending on the process performed. The processor 30 may be used to perform polyimide bake, lead or lead-free reflow, metal anneal, low-k bake, or other processes involving heating.

At the conclusion of thermal processing, the heating elements 62, 108 and 122 are turned off. The heater lift motor 78 is energized in reverse, lifting the heater 44 up from the position shown in FIG. 2, to the position shown in FIGS. 1 and 3. The cooling jacket 48 remains in the down position as shown in FIG. 3. The wafers 212 cool initially primarily via radiation heat transfer, with the cooling jacket 48 absorbing primarily radiant heat. Cooling liquid is pumped through the cooling coils 152 in the chamber cooling jacket 48, so that the jacket 48 remains at a relatively low temperature, despite heat transfer from the wafers 212 and jar 54 to the cooling jacket 48.

The cooling jacket 48 also acts as a thermal barrier, preventing excessive heating of any objects (e.g., other processors, enclosure walls, etc.) adjacent to the processor 30. Referring still to FIG. 3, after completion of thermal processing and the heater 44 is returned to its original position, the heater 44 may remain hot for a substantial amount of time. The upper cooling shroud 40 then acts as a thermal barrier to prevent the heater 44 from excessively heating nearby objects, similar to the cooling jacket 48. Coolant liquid is pumped through the shroud cooling coils 162 to maintain the shroud 40 at a relatively low temperature, despite heating by the heater 44.

Referring to FIG. 12, the jar 54 and wafers 212 may also be cooled by natural convection via airflow through openings 86 in the lift ring 136, allowing air to flow upwardly along the outside surfaces of the jar 54 and out of the processor 30 through the heater vent 112. The convection slots 86 allow air to flow upwardly between the outside surface of the jar 54 and the cooling jacket 48, in the direction of the arrows shown in FIG. 12. Forced air may optionally be pumped through the cooling slots 86 to provide forced convection cooling. After the wafers 212 have sufficiently cooled, the motor 90 is energized in reverse, to lift the cooling jacket 48 and the jar 54 back into the load/unload position shown in FIG. 1. Referring to FIG. 12, the gap or dimension G between the edge of the wafer 212 and the inner wall of the jar 54 may be minimized to e.g., less than about 10, 8, 6, or 4 millimeters to increase conductive heat transfer across the gap.

Forced convection cooling may also be used by providing one or more air amplifiers near the top of the heater, to draw air flow through the vent 112 and also through a flow path formed between the heater and the process jar 54. Cooling may also be performed by first raising the heater, and cooling the heater and the process jar 54 by forced convection, while the process jar/wafers also cool via radiation. The heater is then lowered after a selected time interval, to continue cooling both the heater and the wafers in the process jar, by forced convection, or optionally by natural convection.

In some applications, such as anneal processes, excessive oxidation may occur if the heated wafers are exposed to oxygen. In the specific case of a copper anneal, the copper film on the wafer surface generally should not be exposed to oxygen when the wafer temperature exceeds about 70° C., or significant oxidation of the metal film may occur. As a result, the wafers 212 must remain sealed within the substantially oxygen free gas environment within the process chamber 52 throughout virtually the entire cool down period. The thermal processor 30 reduces the time required for cooling with the wafers 212 remaining contained within the controlled environment within the process chamber 52.

As shown in dotted lines in FIG. 9, in an alternative embodiment, a separate jar lift 96 may be provided to raise and lower the jar 54 independent of the cooling jacket 48. In this design, the processor 30 includes a heater lift 46, a separately operable cooling jacket lift, similar to the lift 50, and a separately operable jar lift 96. In a processor 30 having a separately operable jar lift 96, the cooling jacket 48 may be partially or fully lifted up while the jar 54 remains sealed. Lifting the cooling jacket 48 partially up provides a larger annular air flow opening around the jar for convection cooling. The vertical position of the cooling jacket 48 may also be selected as a function of temperature, to maximize convective cooling. Alternatively, the jar 54 itself may be partially raised, allowing some convection cooling of the wafers 212 with ambient air, while the cooling jacket 48 remains entirely or partially around the jar 54. For non-oxygen sensitive thermal processing, the heater 44 and the jar 54 may be moved up, to reduce cycle time. The cooling jacket may remain in the down position during this time, to reduce or avoid heating any surrounding system components. Alternatively, the cooling jacket may also be partially or fully raised up.

Figure 13:
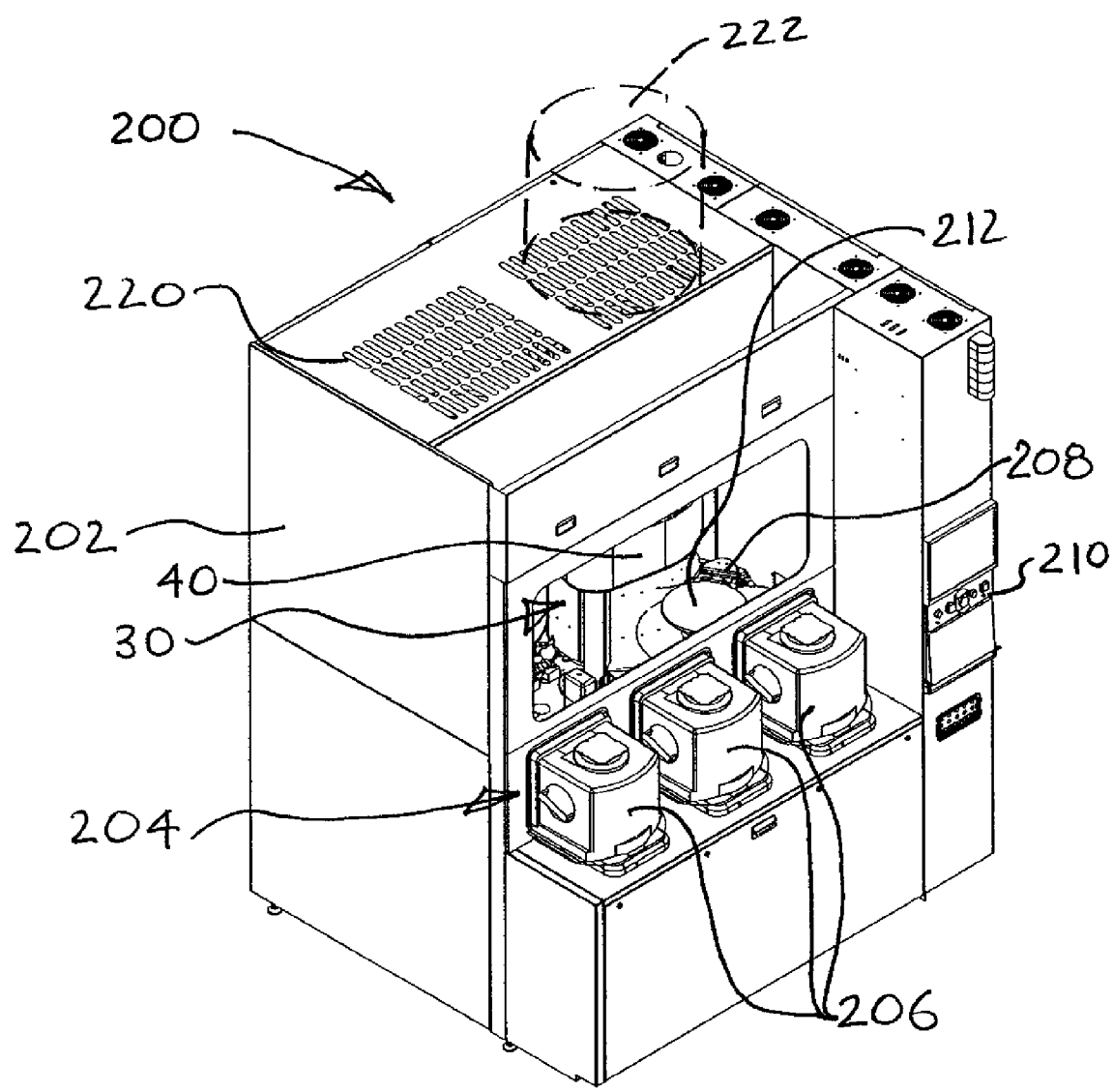
FIG. 13 is a perspective view of an automated processing system.
Figure 14:
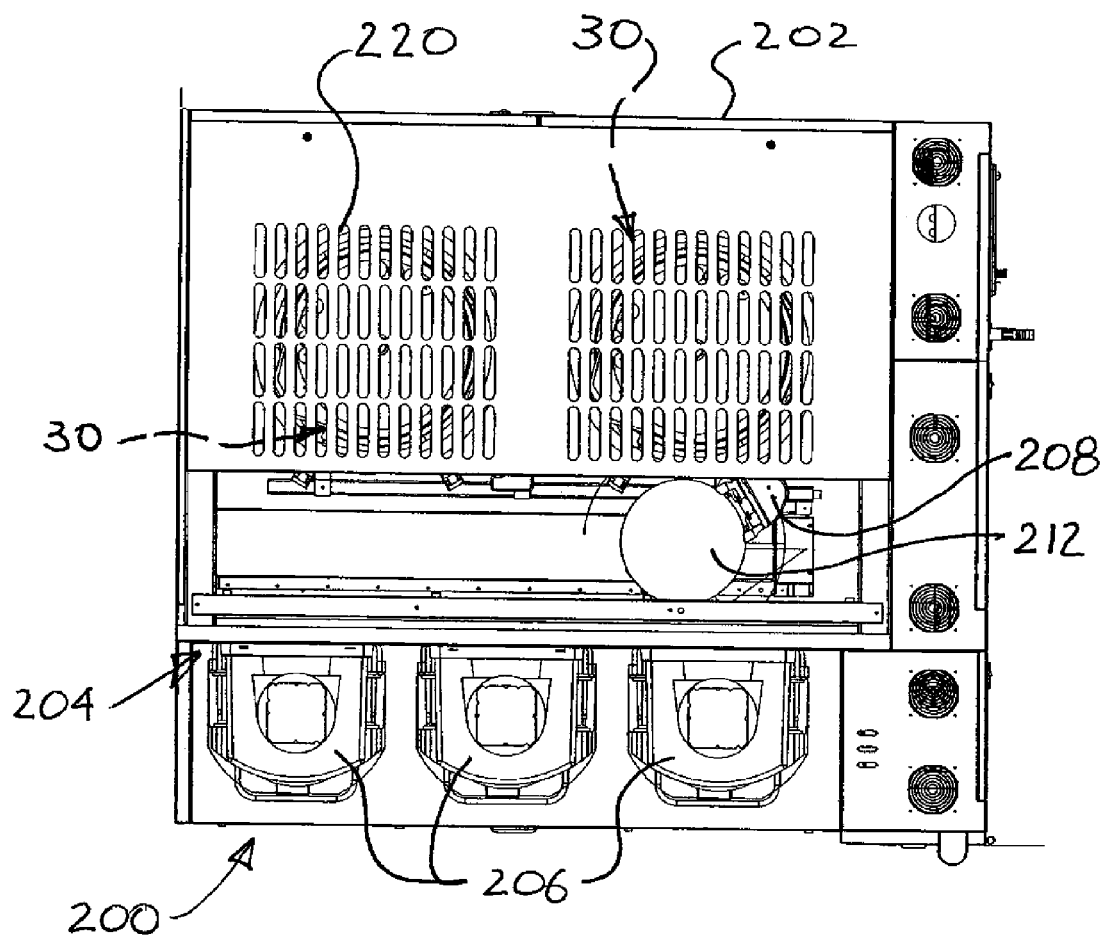
FIG. 14 is a top view of the system shown in FIG. 13.

The thermal processor 30 may be used in an automated processing system. As shown in FIGS. 13 and 14, thermal processors 30, as described above, are provided within an enclosure 202. Wafers 212 are moved to the system 200 in containers such as front opening unified pods (FOUPs). The pods 206 are placed onto a docking station 204, where the pods are unsealed to allow movement of wafers into and out of the pods 206, as described, for example, in U.S. Pat. No. 6,942,738, incorporated herein by reference. A robot 208 within the enclosure 202 moves wafers 212 between the FOUPs 206 and processors 30. Referring to FIGS. 2, 8, and 13, heated ambient air moves out of the processor 30 through the heater vent 112. With some installations, this heated air can simply be released into the environment. In other installations, it may be moved through an exhaust duct for release at an outdoor location. Alternatively, as shown in dotted lines in FIG. 13, a heat exchanger 13 may be used on top of the enclosure 202 to reduce the temperature of exhaust air moving out of the heater vent 112, before the exhaust air is released or conveyed to another location.

Figure 15:
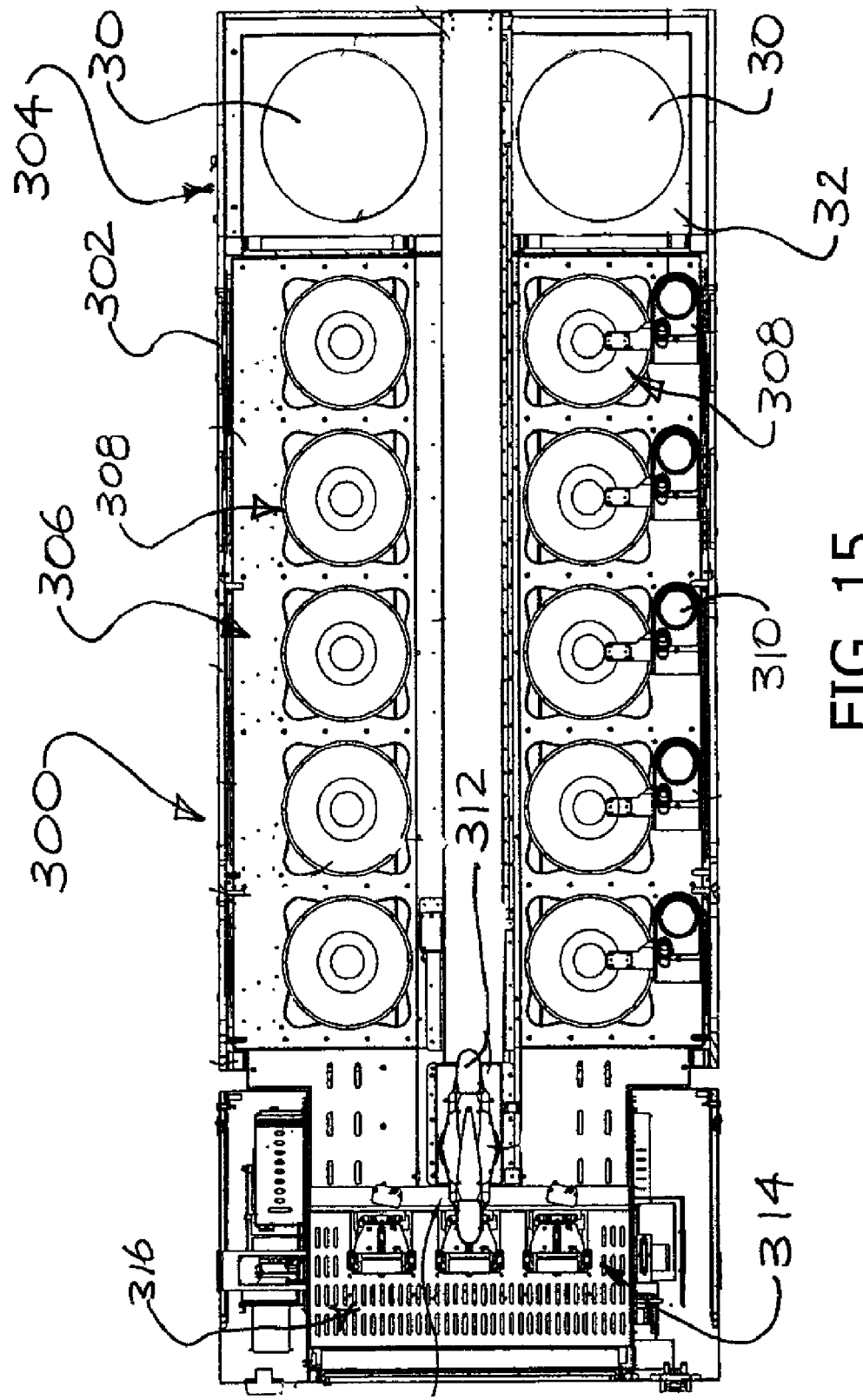
FIG. 15 is a top view of an alternative automated processing system.

FIG. 15 shows an alternative automated processing system which may be used for performing both thermal processing, as well as various other types of processing. As shown in FIG. 15, the system 300 has a batch thermal processing section 304 having one or more thermal processors 30. The system 300 also has a single wafer processing section 306 typically having multiple single wafer processors 308. The single wafer processors 308 may perform various types of processing, including gas or liquid chemical processing, optionally using spin and/or spraying for cleaning, etching, oxide layer formation, etc. The single wafer processors 308 may also perform metal plating processes. One or more of the single wafer processors 308 may be provided with a lift/rotate mechanism 310 to facilitate loading and unloading a wafer, as described for example in U.S. Pat. No. 6,900,132; U.S. Application Nos. 2005/0061438; 2005/0035046 A1; or 2005/0063798 A1, each incorporated herein by reference. The system 300 may include a docking station 316, or other input/output section, for moving wafers into and out of the system 300. A temporary storage or work in progress area 314 may also be included. One or more robots 312 may be used to move wafers between the processors 30 and 308 and the docking station 316.

Since the thermal processors 30 are batch processors and the other processors 308 are single wafer processors, the robot 312 may operate by removing wafers 212, one at a time, from the wafer holder 56 in a processor 30, and then moving the wafers into selected processors 308, i.e., the robot 312 moves the wafers 212 in three dimensions. While two thermal processors 30 are shown in FIG. 15, the system 300 may have only a single thermal processor 30, or it may have more than two thermal processors 30. The number and orientation of the single wafer processors 308 may also vary. FIG. 15 shows two spaced apart rows, each having five single wafer processors 308, with a robot 312 moveable between them. However, various other configurations having a single row, multiple rows, curved or circular arrays, etc. may also be used. The sections 304, 306, and 314 may also be modular, so that they can be arranged and joined to each other as desired for a specific application. Additional modules may also be positioned in-between the sections shown, for other purposes.

Although the processor 30 may primarily be used for processing typical silicon wafers, it may also be used for processing other types of substrates or workpieces as well. The term wafer or workpiece as used here accordingly includes semiconductor wafers, flat panel displays, rigid disk or optical media, thin film heads or other workpieces formed from a substrate on which microelectronic circuits, data storage elements or layers, or micro-mechanical or micro-optical elements may be formed. The term gas here includes vapors as well.

Thus, a novel thermal processor, system, and methods have been shown and described. Various changes and substitutions may of course be made without departing from the spirit and scope of the invention. The invention, therefore, should not be limited, except to the following claims and their equivalents.

The invention claimed is:

1. A thermal processor, comprising:
   a process chamber vessel;
   a cooling jacket substantially surrounding the process chamber vessel;
   a heater movable from a first heater position, to a second heater position wherein the heater is substantially between the process chamber vessel and the cooling jacket, and wherein the heater substantially surrounds the process chamber vessel;
   a holder having multiple workpiece holding positions, with the process chamber vessel moveable from a first vessel position, to a second vessel position wherein the process chamber vessel substantially surrounds the holder; and
   a cooling shroud fixed relative to the holder, and with the cooling shroud substantially surrounding the heater when the heater is in the first heater position.

2. The thermal processor of claim 1 further comprising a heater lifter attached to the heater and adapted to move the heater from the first heater position to the second heater position.

3. The thermal processor of claim 2 wherein the heater lifter extends into cooling shroud.

4. The thermal processor of claim 1 further comprising a vessel lifter adapted to move the vessel together with the cooling jacket.

5. The thermal processor of claim 1 wherein the vessel, the heater and the cooling jacket have cylindrical sidewalls, and wherein the vessel, the heater and the cooling jacket are substantially concentric with each other.

6. The thermal processor of claim 1 with the holder including at least one upper end plate and at least one lower end plate, and with the workpiece holding positions between the upper end plate and the lower end plate.

7. The thermal processor of claim 1 with the cooling jacket having jacket cooling coils and the cooling shroud having shroud cooling liquid coils, and further comprising a cooling liquid supply connected to the jacket cooling coils and to the shroud cooling coils.

8. A method of thermally processing a batch of workpieces, comprising:
   loading workpieces into a holder;
   moving a process chamber vessel into a position around the holder;
   sealing the process chamber vessel;
   moving a heater into a position substantially around the process chamber vessel;
   heating the workpieces within the process chamber with the heater;
   removing the heater from the position around the process chamber vessel into a position substantially within a cooling shroud;
   cooling the workpieces at least in part by absorbing thermal radiation from the process chamber vessel with a cooling jacket around the process chamber; and removing the process chamber vessel and the cooling jacket from around the holder.

9. The method of claim 8 further comprising heating the workpieces with a base heater.

10. The method of claim 8 further comprising turning the heater off, and then moving the heater back into a position at least partially around the process chamber vessel after the workpieces have cooled to a temperature below a pre-selected temperature.

11. The method of claim 8 further comprising providing a process gas into the process chamber.

12. The method of claim 8 further comprising turning the heater on before moving the heater into a position substantially around the process chamber vessel.

13. The thermal processor of claim 10 further comprising cooling the process chamber vessel via forced convection.

14. A workpiece processing system, comprising:
one or more batch thermal processor including:
a process chamber vessel;
a cooling jacket substantially surrounding the process chamber vessel;
a heater movable from a first heater position, to a second heater position wherein the heater is substantially between the process chamber vessel and the cooling jacket, and wherein the heater substantially surrounds the process chamber vessel;
a holder having multiple workpiece holding positions, with the process chamber vessel moveable from a first vessel position, to a second vessel position wherein the process chamber vessel substantially surrounds the holder; and
a cooling shroud fixed relative to the holder, and with the cooling shroud substantially surrounding the heater when the heater is in the first heater position;
a plurality of single wafer processors; and
a robot moveable to carry one or more workpieces from the batch thermal processor to one or more of the single wafer processors.

15. The workpiece processing system of claim 14 wherein one or more of the single wafer processors comprise spin/spray processors.

16. The workpiece processing system of claim 14 further comprising an enclosure, with the batch thermal processor, the plurality of the single wafer processors, and the robot within the enclosure.

17. A thermal processing system, comprising:
an enclosure;
a load/unload opening in the enclosure;
one or more batch thermal processors within the enclosure, and including:
a process chamber vessel;
a cooling jacket substantially surrounding the process chamber vessel;
a heater movable from a first heater position, to a second heater position wherein the heater is substantially between the process chamber vessel and the cooling jacket, and wherein the heater substantially surrounds the process chamber vessel;
a holder having multiple workpiece holding positions, with the process chamber vessel moveable from a first vessel position, to a second vessel position wherein the process chamber vessel substantially surrounds the holder;
a cooling shroud fixed relative to the holder, and with the cooling shroud substantially surrounding the heater when the heater is in the first heater position; and
a robot moveable to carry workpieces from the load/unload opening to a batch thermal processor.

18. A thermal processor, comprising:
a process jar;
a holder in the process jar, with holder having multiple workpiece holding positions;
heating means for heating workpieces within the process jar;
jar cooling means for absorbing heat from the workpieces within the process jar; and
heater cooling means fixed relative to the holder, and with the heating means movable from a position substantially surrounded by the heater cooling means, to a position substantially around the process jar.

19. Apparatus comprising:
a process jar;
a process jar lifter attached to the process jar;
a cooling jacket positionable around the process jar;
a cooling jacket lifter attached to the cooling jacket;
a heater;
a heater lifter attached to the heater, for moving the heater between a first heater position and a second heater position, and with the heater substantially between the cooling jacket and the process jar, when the heater is in the second heater position;
a holder having multiple wafer holding positions, with the process jar moveable from a process jar position, to a second process jar position wherein the process jar substantially surrounds the holder; and
a cooling shroud fixed in position relative to the holder, and with the cooling shroud substantially surrounding the heater when the heater is in the first heater position.

* * * * *